United States Patent
Noda et al.

(10) Patent No.: US 7,305,596 B2
(45) Date of Patent: Dec. 4, 2007

(54) NONVOLATILE MEMORY AND NONVOLATILE MEMORY APPARATUS

(75) Inventors: Satoshi Noda, Ome (JP); Kenji Kozakai, Tachikawa (JP); Toru Matsushita, Kokubunji (JP); Yusuke Jono, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 178 days.

(21) Appl. No.: 11/182,781

(22) Filed: Jul. 18, 2005

(65) Prior Publication Data

US 2006/0026489 A1 Feb. 2, 2006

(30) Foreign Application Priority Data

Aug. 2, 2004 (JP) ............................. 2004-225271

(51) Int. Cl.
*G11C 29/00* (2006.01)

(52) U.S. Cl. ............ 714/718; 714/746; 714/764; 714/799; 714/810; 714/48; 714/723; 714/733; 714/734; 365/185.09; 365/185.33

(58) Field of Classification Search ............ None
See application file for complete search history.

(56) References Cited

U.S. PATENT DOCUMENTS

| | | | |
|---|---|---|---|
| 5,559,956 A * | 9/1996 | Sukegawa ................ 714/8 |
| 6,185,134 B1 * | 2/2001 | Tanaka ................ 365/185.33 |
| 6,982,904 B2 * | 1/2006 | Shiga .................. 365/185.09 |
| 7,184,356 B2 * | 2/2007 | Noguchi et al. ........ 365/230.03 |
| 2004/0156251 A1 | 8/2004 | Shiota et al. ............... 365/200 |
| 2005/0180211 A1 * | 8/2005 | Guterman et al. ..... 365/185.03 |

FOREIGN PATENT DOCUMENTS

JP 2004-240793 8/2004

* cited by examiner

*Primary Examiner*—Guy Lamarre
*Assistant Examiner*—John P Trimmings
(74) *Attorney, Agent, or Firm*—Miles & Stockbridge P.C.

(57) ABSTRACT

To provide a technique which enables a load on a controller to be reduced by rapidly detecting n-bit errors during writing/erasing on a chip in ECC in a nonvolatile memory. A flash memory of the present invention, which is a nonvolatile memory that includes plural electrically erasable and writable nonvolatile memory cells and performs write-and-verify processing in a write operation on the nonvolatile memory cells, includes an ECC determination circuit that counts the number of bits of write error detected in the write-and-verify processing, and outputs the information, and a status register for holding pass/fail information of the write operation and the information about the number of bits of write error outputted from the ECC determination circuit.

6 Claims, 12 Drawing Sheets

ERROR BIT = DETERMINATION LEVEL 1 (0 bit)
         + DETERMINATION LEVEL 2 (1 bit) = 1 bit ERROR BIT = DETERMINATION LEVEL 1 (1 bit)
         + DETERMINATION LEVEL 2 (1 bit) = 2 bits

NONVOLATILE MEMORY AND NONVOLATILE MEMORY APPARATUS

CROSS REFERENCE TO RELATED APPLICATION

The present application claims priority from Japanese patent application No. 2004-225271 filed on Aug. 2, 2004, the content of which is hereby incorporated by reference into this application.

BACKGROUND OF THE INVENTION

The present invention relates to a nonvolatile memory and a memory card including the memory, and more particularly to a technique operatively applied to the detection and correction (ECC) of write/erase bit errors of the nonvolatile memory.

As a technology studied by the inventors, in a write operation on a nonvolatile memory such as a flash memory, verify processing is performed to determine whether the threshold voltage of memory cell reaches an expected value. In the verify processing, generally, writing and verifying are repeated until all the bits to be written pass. A write error of even one bit during the write operation is handled as a write error. To save the write error, a technique for detecting and correcting error bits is available (hereinafter referred to as "ECC". ECC: Error Check and Correct).

Japanese Patent Application No. 2003-030292 (Laid-Open No. 2004-240793) describes a memory card comprising a nonvolatile memory and a controller. The controller of the memory card has an ECC function for detecting and correcting error bits of the memory. Since up to one-bit error can be easily corrected, the controller usually corrects bit errors. Since two-bit errors require longer time for correction than with one-bit errors and occur less frequently, the occurrence of two-bit errors when detected is reported by the controller to a host, which determines whether to correct the errors before giving a correction command.

SUMMARY OF THE INVENTION

By the way, the inventors studied the technique of the nonvolatile memory or memory card as described previously, with the result that the following facts were clarified.

In conventional nonvolatile memories, even errors of one bit have been handled as write errors. Therefore, to determine whether ECC correction is possible, all data must have been read. That is, a controller within a memory card has performed null reading of all data to determine whether the number of error bits is the number of bits or less that can be subjected to ECC correction. Therefore, the controller has been heavily loaded and error notification to a host has required long time.

An object of the present invention is to provide a technique which enables a load on a controller to be reduced by rapidly detecting n-bit errors during writing/erasing on a chip in ECC in a nonvolatile memory.

The above-mentioned and other objects and novel characteristics of the present invention will become apparent from the description of this specification and the accompanying drawings.

The typical disclosures of the invention will be described in brief as follows.

(1) A nonvolatile memory of the present invention includes plural electrically erasable and writable nonvolatile memory cells and performs write-and-verify processing in a write operation on the nonvolatile memory cells. The nonvolatile memory includes an error correction determination part that counts the number of bits of write error detected in the write-and-verify processing, and outputs the information, and a register for holding the information about the number of bits of write error outputted from the error correction determination part.

(2) A nonvolatile memory of the present invention includes plural electrically erasable and writable nonvolatile memory cells and performs write-and-verify processing in a write operation on the nonvolatile memory cells. The nonvolatile memory includes an error correction determination part that counts the number of bits of write error detected in the write-and-verify processing, and outputs the information, and a register for holding pass/fail information of the write operation and the information about the number of bits of write error outputted from the error correction determination part.

(3) A memory card of the present invention includes a nonvolatile memory that includes plural electrically erasable and writable nonvolatile memory cells and performs write-and-verify processing in a write operation on the nonvolatile memory cells, and a controller that controls the operation of the nonvolatile memory. The nonvolatile memory includes an error correction determination part that counts the number of bits of write error detected in the write-and-verify processing, and outputs the information, and a register for holding the information about the number of bits of write error outputted from the error correction determination part. The controller includes means for reading the information about the number of bits of write error from the register, and an error correction propriety determination part that determines whether to correct the write error and whether a rewrite is required, based on the information about the number of bits of write error.

(4) A memory card of the present invention includes a nonvolatile memory that includes plural electrically erasable and writable nonvolatile memory cells and performs write-and-verify processing in a write operation on the nonvolatile memory cells, and a controller that controls the operation of the nonvolatile memory. The nonvolatile memory includes an error correction determination part that counts the number of bits of write error detected in the write-and-verify processing, and outputs the information, and a register for holding pass/fail information of the write operation and the information about the number of bits of write error outputted from the error correction determination part. The controller includes means for reading the pass/fail information of the write operation and the information about the number of bits of write error from the register, and an error correction propriety determination part that determines whether to correct the write error and whether a rewrite is required, based on the information about the number of bits of write error when the pass/fail information of the write operation indicates fail.

Effects obtained by typical disclosures of the invention will be described in brief as follows.

Since information indicating whether ECC correction is possible or impossible is outputted from the nonvolatile memory, null reading of memory data by the controller becomes unnecessary and a load on the controller is reduced.

Depending on the reliability of data to be written to the nonvolatile memory and the amount of write data per time, rewriting is not performed even when a write error occurs. Thereby, a write speed as the memory card can be increased.

DETAILED DESCRIPTION OF THE PREFERRED EMBODIMENTS

Figure 1:
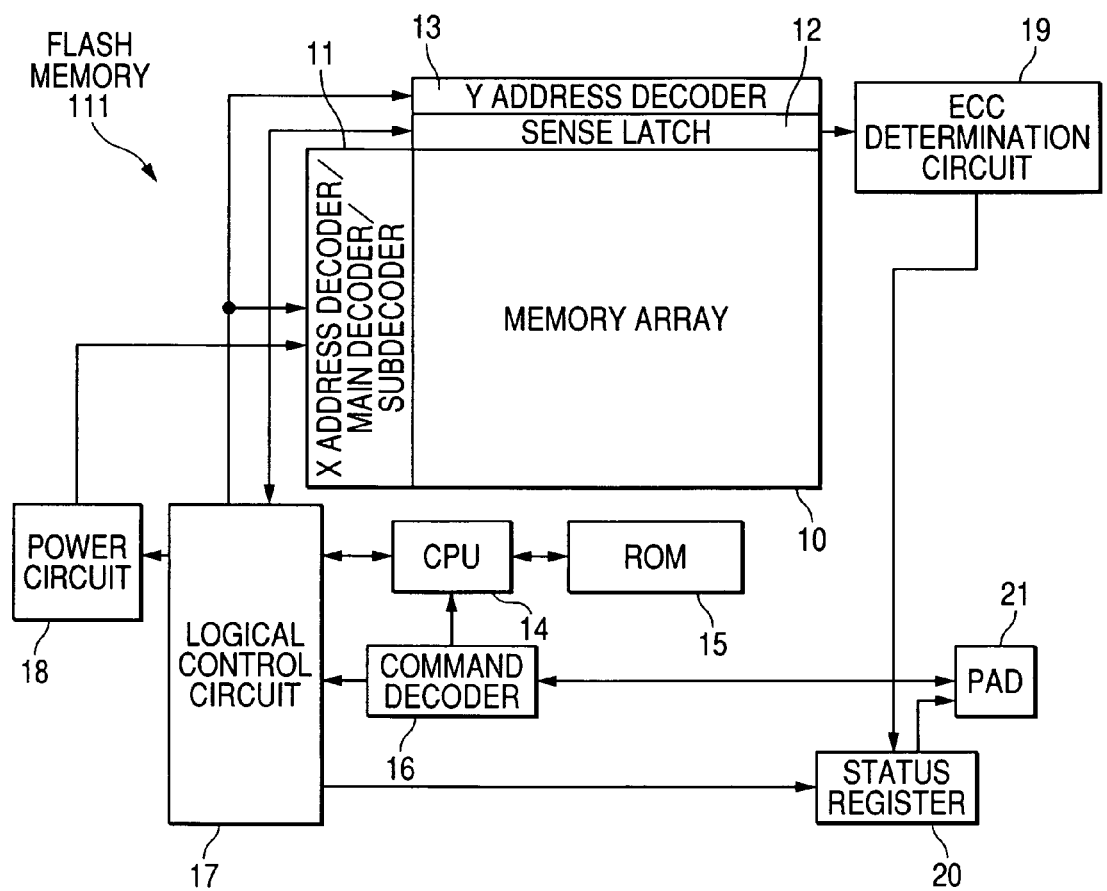
FIG. 1 is a block diagram showing the configuration of a nonvolatile memory according to a first embodiment of the present invention.

Hereinafter, embodiments of the present invention will be described with reference to the accompanying drawings. In all drawings for describing the embodiments, same members are identified in principle by the same reference numerals, and duplicate descriptions of them will be omitted.

First Embodiment

Figure 2:
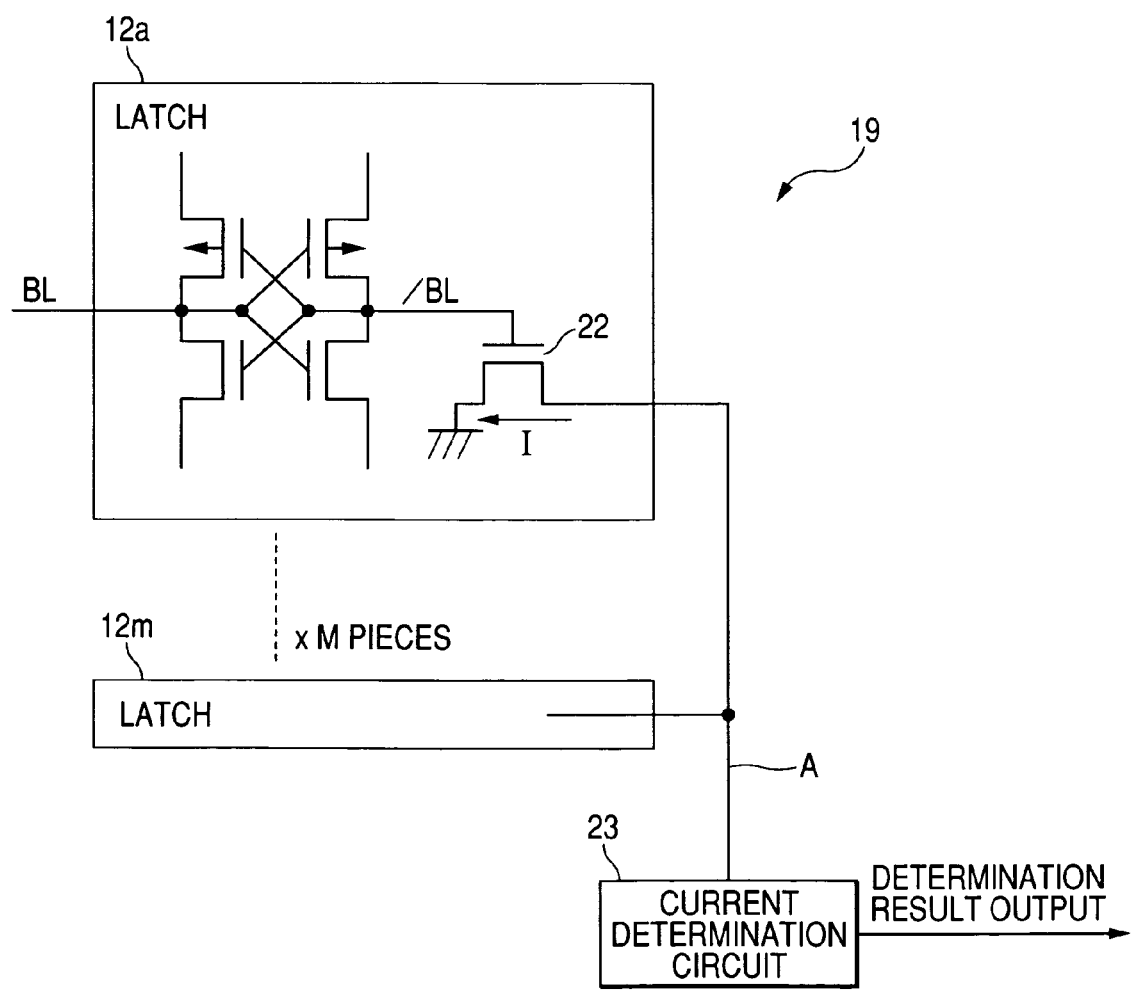
FIG. 2 is a drawing showing the configuration of an ECC determination circuit in a nonvolatile memory of the first embodiment.
Figure 3:
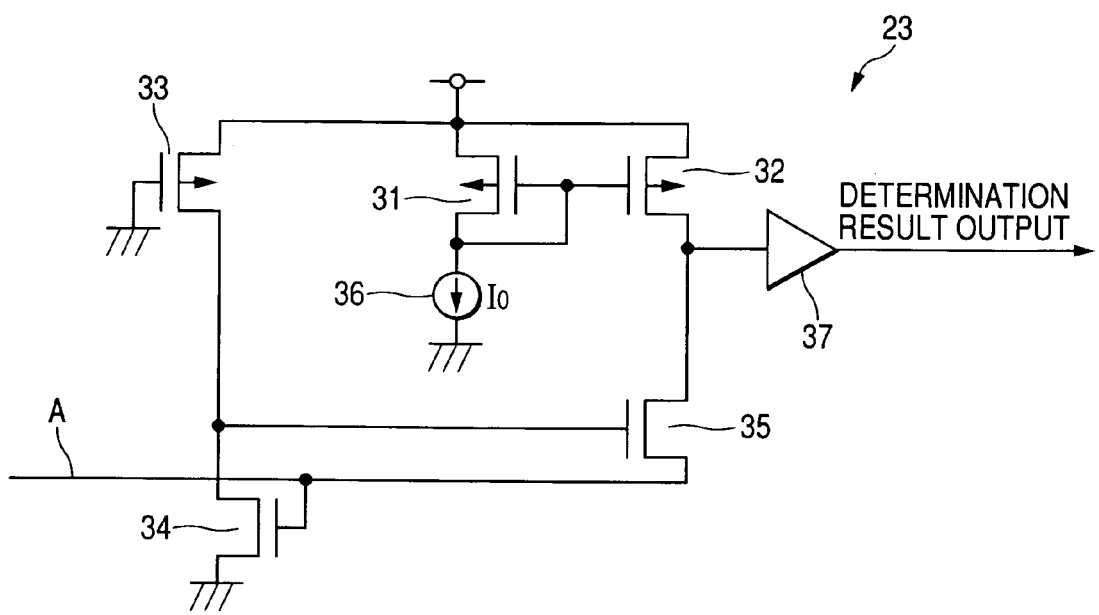
FIG. 3 is a circuit diagram showing an example of the configuration of a current determination circuit shown in FIG. 2.
Figure 4:
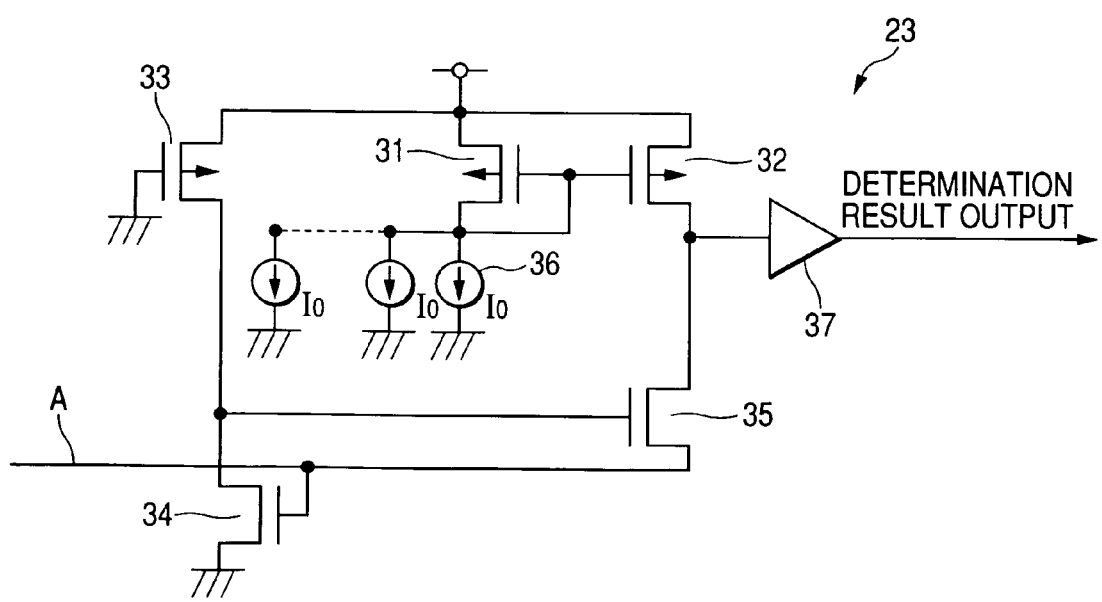
FIG. 4 is a circuit diagram showing an example of the configuration of a current determination circuit shown in FIG. 2.
Figure 5:
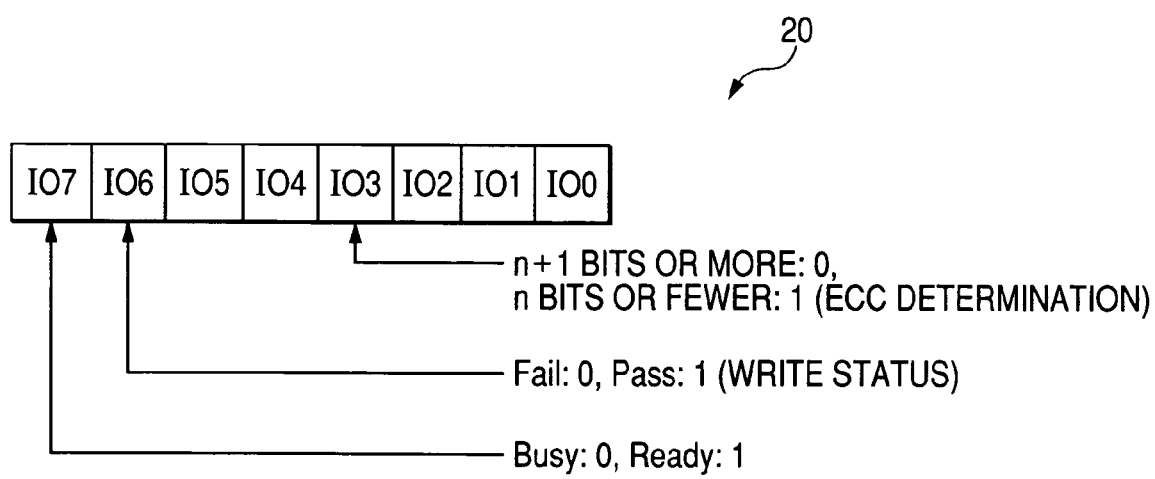
FIG. 5 is a drawing showing the bit configuration of a status register in a nonvolatile memory of a first embodiment of the present invention.
Figure 6:
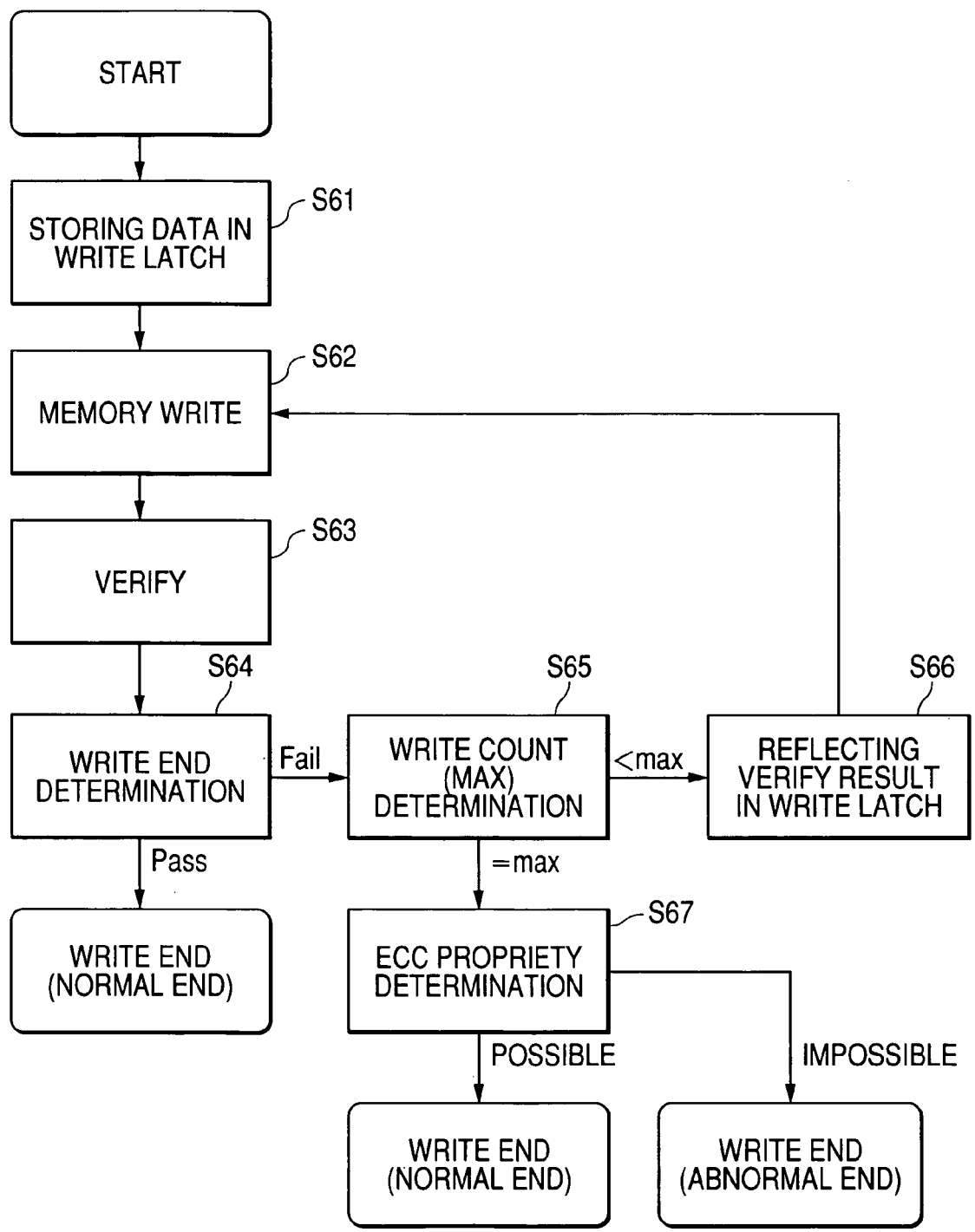
FIG. 6 is a drawing showing the flow of write operation in a nonvolatile memory of a first embodiment of the present invention.
Figure 7:
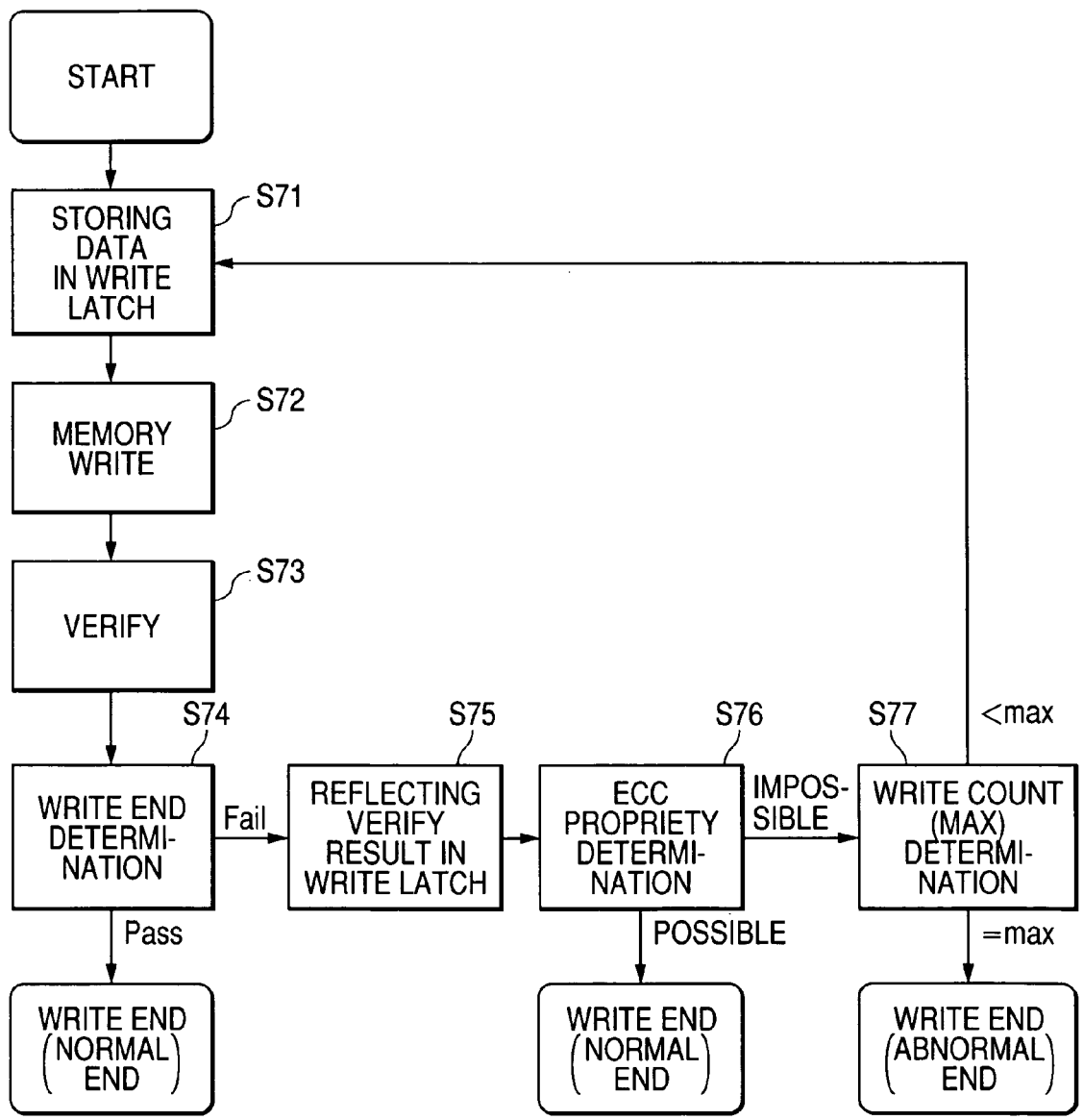
FIG. 7 is a drawing showing the flow of write operation in a nonvolatile memory of a first embodiment of the present invention.
Figure 8:
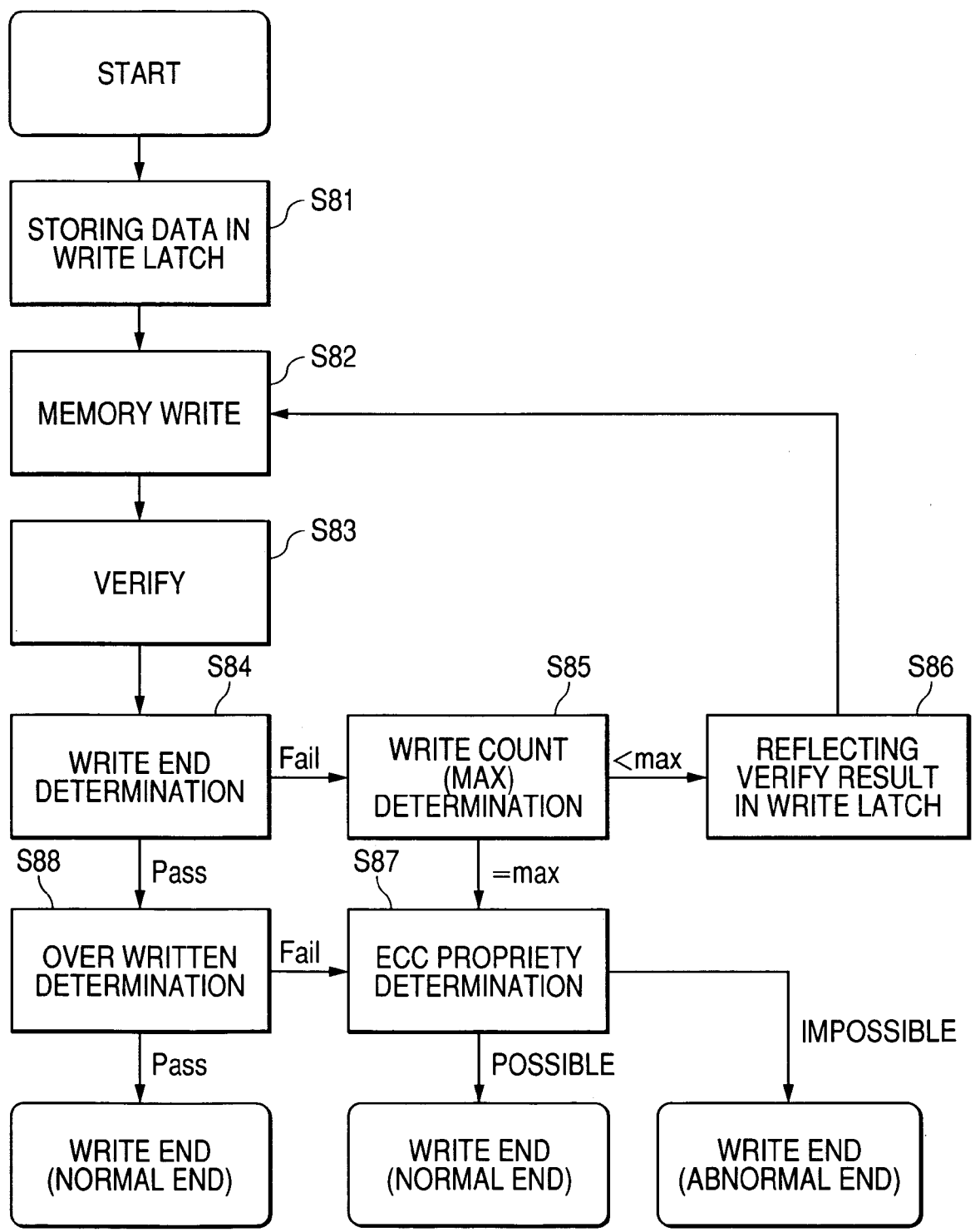
FIG. 8 is a drawing showing the flow of write operation on multi-level memory cells in a nonvolatile memory of a first embodiment of the present invention.
Figure 9:
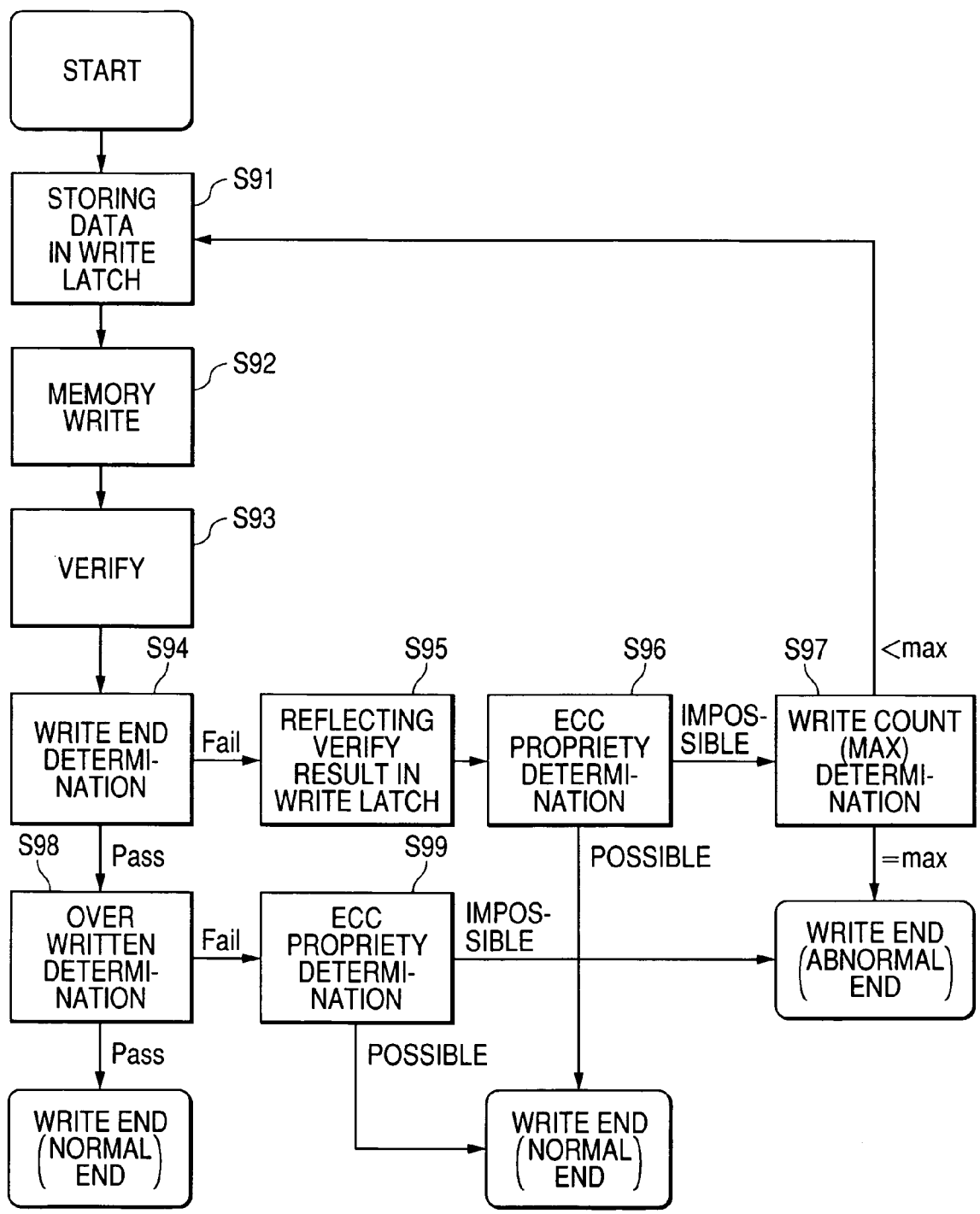
FIG. 9 is a drawing showing the flow of write operation on multi-level memory cells in a nonvolatile memory of a first embodiment of the present invention.
Figure 10A:
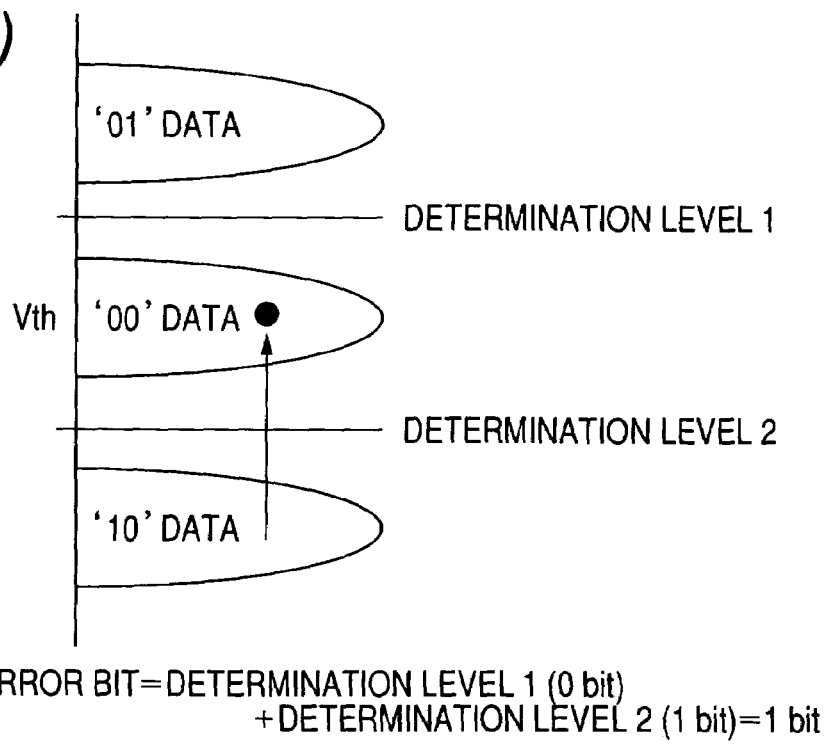
FIGS. 10A an 10B are explanatory drawings showing the number of error bits of multi-level memory cells in a nonvolatile memory of a first embodiment of the present invention.
Figure 10B:
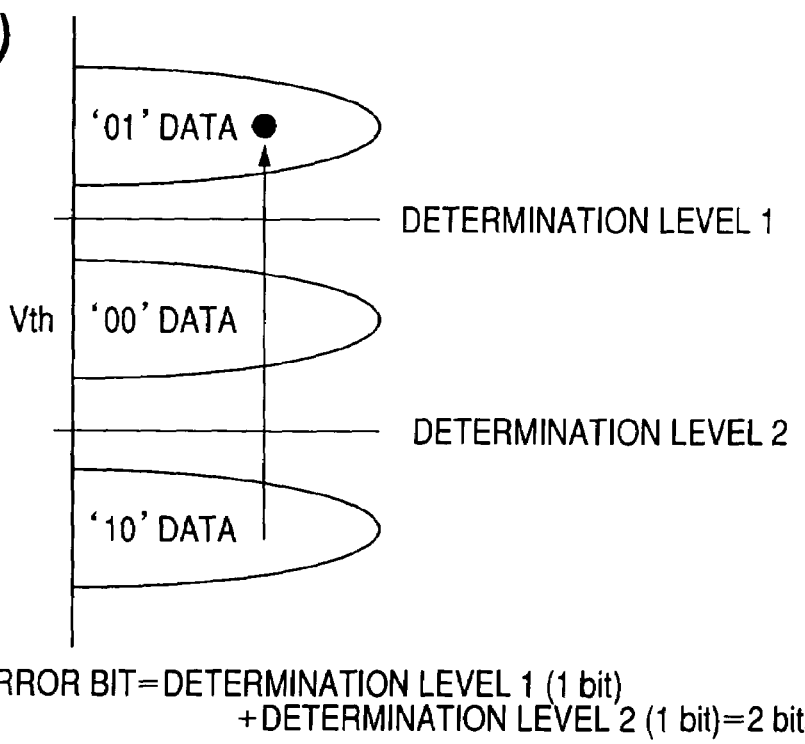

FIG. 1 is a block diagram showing the configuration of a nonvolatile memory according to a first embodiment of the present invention. FIG. 2 is a drawing showing the configuration of an ECC determination circuit in a nonvolatile memory of the first embodiment. FIGS. 3 and 4 are drawings showing a current determination circuit in the ECC determination circuit. FIG. 5 is a drawing showing the bit configuration of a status register. FIGS. 6 and 7 are drawings showing the flow of write operation. FIGS. 8 and 9 are drawings showing the flow of write operation of multi-level memory cells. FIGS. 10A and 10B are explanatory drawings showing the number of error bits of multi-level memory cells.

Referring to FIG. 1, an example of the configuration of nonvolatile memory according to the first embodiment will be described. A nonvolatile memory of the present embodiment, which is, for example, a flash memory 111, comprises a memory array 10 including plural nonvolatile memory cells, an X address decoder/main decoder/sub-decoder 11, a sense latch 12, a Y address decoder 13, a CPU 14, a ROM 15 storing a sequence program that controls the operation of flash memory 111, a command decoder 16, a logical control circuit 17, a power circuit 18, an ECC determination circuit (error correction determination part) 19, a status register 20, and a PAD (pad) 21. The nonvolatile memory is formed on one semiconductor chip by well-known semiconductor manufacturing technology.

In the flash memory, though not shown, control signals such as chip enable signal, read enable signal, write enable signal, command latch enable signal, address latch enable signal, and reset signal are inputted to the logical control circuit 17 and the like through external terminals and buffer. Output of the logic control circuit 17 is inputted to the X address decoder/main decoder/subdecoder 11, sense latch 12, Y address decoder 13, CPU 14, power circuit 18, and status register 20. Output of the power circuit 18 is inputted to the X address decoder/main decoder/subdecoder 11. Output of the sense latch 12 is inputted to the logic control circuit 17 and the ECC determination circuit 19. Output of the CPU 14 is inputted to the logic control circuit 17 and the ROM 15. Output of the ROM 15 is inputted to the CPU 14. Output of the command decoder 16 is inputted to the CPU 14, the logic control circuit 17, and the PAD 21. Output of the ECC determination circuit 19 is inputted to the status register 20. Output of the status register 20 is inputted to the PAD 21. Output of the PAD 21 is inputted to the command decoder 16.

In the flash memory 111, the memory array 10 comprises plural electrically erasable/writable nonvolatile memory cells arranged at intersections of word lines and bit lines. The nonvolatile memory cells are binary memory cells capable of storing one-bit information per memory cell or multi-level memory cells capable of storing multiple-bit (e.g., two bits) information per memory cell.

An arbitrary memory cell in the memory array 10 is selected by the X address decoder/main decoder/subdecoder 11 and the Y address decoder 13, and data is written to or read from the selected memory cell through the sense latch 12. The sense latch 12 comprises plural latches 12a to 12m each connected to each bit lines BL and /BL, as shown in FIG. 2. The number of the latches 12a to 12m corresponds to the number of bit lines BL and /BL. This embodiment assumes that the number of bit line pairs, that is, the number of latches is M.

Control of the generation of timing signals for data writing/reading is performed by the logical control circuit 17 and the like. The command decoder 16 decodes a command inputted from the outside through PAD 21. According to the decoded command, the logical control circuit 17, the CPU 14, and the ROM 15 perform memory operations such as writing, reading, and erasing for memory cells by executing a sequence program stored in the ROM 15.

In a write operation on a memory cell, write-and-verify processing is performed. In the write-and-verify processing, whether the threshold voltage of the memory cell to write to reaches an expected value is checked to detect a write error.

The following describes an example of the configuration of the ECC determination circuit 19 with reference to FIG. 2. The ECC determination circuit 19 counts the number of bits of write error detected in the write-and-verify processing and outputs the information.

FIG. 2 shows an example of the configuration of the ECC determination circuit 19. The ECC determination circuit 19 comprises nMOS 22 transistors respectively provided in M latches 12a to 12m constituting the sense latch 12, a current determination circuit 23, and the like. The source of an n MOS transistor 22 is grounded, the gate is connected to a bit line /BL, and the drain is connected to a node A of the current determination circuit.

In verify processing during a write operation, the ECC determination circuit 19 captures the results of verifying individual bits into the latches 12a to 12m, and then feeds a current to the nMOS transistors 22 added to the latches 12a to 12m. When the verify result is normal, the bit line BL becomes "1" and the bit line/BL becomes "0". Therefore, for a normal bit, since the bit line/BL is "0", the nMOS transistor 22 is off and current I does not flow from the drain to the source. On the other hand, for an error bit, the bit line/BL becomes "1", and the nMOS transistor 22 is on and current I flows from the drain to the source. The sum total ($\Sigma I$) of the currents I is proportional to the number of bits of write error. Therefore, by finding the sum total ($\Sigma I$) of the currents I, the number of bits of write error can be counted.

The current determination circuit 23 converts the sum total ($\Sigma 1$) of the currents I into the number of bits, determines whether the number of bits of write error is n or less, and outputs the information as a determination result. n is a natural number.

FIG. 3 shows an example of the current determination circuit 23. The current determination circuit 23 of FIG. 3, which is an application of, for example, a differential amplifier, comprises pMOS transistors 31, 32, and 33, nMOS transistors 34 and 35, constant-current source 36, buffer 37, and like. The drain and the gate of the pMOS transistor 31 are connected to the positive electrode of the constant-current source 36 and the gate of the pMOS transistor 32, respectively, and its source is connected to the power supply. The source of the pMOS transistor 32 is connected to the power supply, and its drain is connected to the drain of the nMOS transistor 35 and the input of the buffer 37. The source of the pMOS transistor 33 is connected to the power supply, the gate is grounded, and its drain is connected to the gate of the nMOS transistor 35 and the drain of the nMOS transistor 34. The gate of the nMOS transistor 34 is connected to the source of the nMOS transistor 35 and the node A, and its source is grounded. The negative electrode of the constant-current source 36 is grounded.

The pMOS transistors 31 and 32 constitute a current mirror circuit, the pMOS transistor 33 constitutes a bias circuit, and the nMOS transistor 34 and 35 constitute an amplifier. A current flowing through the node A is the sum total ($\Sigma I$) of the currents I of FIG. 2, and a result of comparison with a current I0 flowing through the constant-current source 36 is outputted through the buffer 37. That is, output of the buffer 37 is "0" when $\Sigma I > I0$, and "1" when $\Sigma I < I0$. Therefore, the current determination circuit 23 can determine whether the number of bits of write error is n or less, by adjusting the current value I0. As means for adjusting the current value I0, for example, as shown in FIG. 4, the value of n can be set to any value by changing the number of plural constant-current sources 36 connected in parallel.

A determination result of ECC determination circuit 19 is stored in the status registers 20 described later. In FIGS. 2 to 4 described above, as long as the same effects are obtained, logics, power/grounding, and pMOS/nMOS may be reverse. Bipolar transistors or the like may be used instead of MOS transistors.

The following describes the bit configuration of status register 20 with reference to FIG. 5. The status register 20 is a storage device that holds information representative of the status of the nonvolatile memory of the first embodiment. FIG. 5 shows a register consisting of eight bits as an example of the status register 20. The status register 20 holds information about the number of bits of write error outputted from the ECC determination circuit 19 (whether the number of bits of write error is n or less). Each bit indicates various states of the nonvolatile memory. In the first embodiment, the status register 20 is provided with bits such as IO7 that indicates write operation busy/end, IO6 that indicates write status (pass/fail), and IO3 that indicates ECC determination information. When IO7 is "0", it indicates that a processing operation such as a write operation is in progress in the flash memory 111, that is, a busy state. When IO7 is "1", it indicates that no processing operation is in progress in the flash memory 111, that is, a ready state. When IO6 is "0", it indicates that a write operation fails. When IO6 is "1", it indicates that a write operation passes. When IO3 is "0", it indicates that the number of bits of write error is n+1 or more, and when IO3 is "1", it indicates that the number of bits of write error is n or less. A determination result of the ECC determination circuit 19 is written to IO3.

Therefore, whether ECC correction is possible is easily determined by reading information about the number of bits of write error written to IO3 of the status register 20 from the outside of the flash memory 111.

The following describes an example of the flow of write operations on binary memory cells of the flash memory of the first embodiment with reference to FIG. 6.

Step S61 writes data to a write latch (sense latch 12, latches 12a to 12m). Step S62 writes the data to the memory cells to write to within the memory array 10. Step S63 verifies the written data. The verify operation is performed as to whether threshold voltages of the memory cells reach a lower limit value of the range of threshold voltages to be set. Step S64 determines whether to end the write operation by checking for the existence of a write error. For a pass result in Step S64, the write operation is ended (normal end). For a fail result, the processing proceeds to Step S65. The determination result of pass/fail in Step S64 is written to IO6 of the status register 20 shown in FIG. 5. Step S65 determines whether the number of writes reaches the maximum value (max). When the number of writes is less than the maximum value (max), the processing proceeds to Step S66 to reflect the verify result in the write latch, and a rewrite operation is performed in Step S62. At this time, a rewrite operation is not performed for memory cells the threshold voltage of which is above the lower limit, and a rewrite operation is performed only for memory cells the threshold voltage of which is below the lower limit. When the number of writes reaches the maximum value (max) as a result of the determination of Step S65, the processing proceeds to Step S67 to determine whether ECC correction is possible. Step S67 counts the number of bits of write error by the ECC determination circuit 19 shown in FIGS. 2 to 4, and writes the information to IO3 in the status register 20. As a result of determining whether ECC correction is possible in Step S67, when the number of bits of write error is n or less, it is determined that error correction is possible, and the write operation is ended (normal end). As a result of determining whether ECC correction is possible in Step S67, when the number of bits of write error is n+1 or more, it is determined that error correction is impossible, and the write operation is ended (abnormal end). The above-mentioned write operation flow, which determines whether ECC correction is possible for the first time when the number of writes reaches the maximum value, is suitable for electronic data of papers and the like required to be highly correct.

The following describes another example of the flow of write operations on binary memory cells of the flash memory of the first embodiment with reference to FIG. 7.

A description of Steps S71 to S74 will be omitted because they are the same as Steps S61 to S64.

For a pass result in write end determination in Step S74, the write operation is ended (normal end). For a fail result in Step S74, the processing proceeds to Step S75. The determination result of pass/fail in Step S74 is written to IO6 of the status register 20 shown in FIG. 5. Step S75 reflects the verify result in the writing latch, and the processing proceeds to Step S76 to determine whether ECC correction is possible. Step S76 counts the number of bits of write error by the ECC determination circuit 19 shown in FIGS. 2 to 4, and writes the information to IO3 in the status register 20. As a result of determining whether ECC correction is possible in Step S76, when the number of bits of write error is n or less, it is determined that error correction is possible, and the write operation is ended (normal end). As a result of determining whether ECC correction is possible in Step S76, when the number of bits of write error is n+1 or more, it is determined that error correction is impossible, and the processing proceeds to S77. Step S77 determines whether the number of writes reaches the maximum value (max). When the number of writes is less than the maximum value (max), the processing returns to Step S71 to store the data in the write latch. When the number of writes reaches the maximum value (max) as a result of the determination in Step S77, the write operation is ended (abnormal termination). The write operation flow determines whether ECC correction is possible before determining the number of writes, and ends normally when error correction is possible. Therefore, the write operation flow is suitable for stream data such as images, voice, and video that is not required to be highly correct. However, this operation flow reduces write time and improves performance.

The following describes an example of the flow of write operations on a flash memory when memory cells are multi-level memory cells, with reference to FIG. 8.

A description of Steps S81 to S86 will be omitted because they are the same as Steps S61 to S66.

For a pass result in the write end determination in Step S84, overwritten determination is performed in Step S88. In the overwritten determination, it is determined whether threshold voltages of memory cells exceed an upper limit of the range of threshold voltages to be set. If the overwritten determination in Step S88 determines that there are no memory cells exceeding the upper limit of threshold voltages, it is determined that there is no write error (pass), and the write operation is ended (normal end). If Step S88 determines that there is a memory cell exceeding the upper limit of threshold voltages, it is determined that there is a write error (fail), and the processing proceeds to Step S87 to determine whether ECC correction is possible. The pass/fail result in the overwritten determination in Step S88 is written to IO6 of the status register 20. Step S87 counts the number of bits of write error by the ECC determination circuit 19 shown in FIGS. 2 to 4, and writes the information to IO3 in the status register 20. As a result of determining whether ECC correction is possible in Step S87, when the number of bits of write error is n or less, it is determined that error correction is possible, and the write operation is ended (normal end). As a result of determining whether ECC correction is possible in Step S87, when the number of bits of write error is n+1 or more, it is determined that error correction is impossible, and the write operation is ended (abnormal end). For multi-level memory cells, the above-mentioned write operation flow is repeated according to their level to cumulatively count the number of bits of write error. The above-mentioned write operation flow determines whether ECC correction is possible when the number of writes reaches the maximum value or the overwritten determination proves to be fail. Therefore, the write operation flow is suitable for electronic data of papers and the like required to be highly correct.

The following describes another example of the flow of write operations on a flash memory when memory cells are multi-level memory cells, with reference to FIG. 9.

A description of Steps S91 to S97 will be omitted because they are the same as Steps S71 to S77.

For a pass result in the write end determination in Step S94, overwritten determination is performed in Step S98. In the overwritten determination, it is determined whether threshold voltages of memory cells exceed an upper limit. If the overwritten determination in Step S98 determines that there are no memory cells exceeding the upper limit of threshold voltages, it is determined that there is no write error (pass), and the write operation is ended (normal end). If Step S98 determines that there is a memory cell exceeding the upper limit of threshold voltages, it is determined that there is a write error (fail), and the processing proceeds to Step S99 to determine whether ECC correction is possible. The pass/fail result in the overwritten determination in Step S98 is written to IO6 of the status register 20. Step S99 counts the number of bits of write error by the ECC determination circuit 19 shown in FIGS. 2 to 4, and writes the information to IO3 in the status register 20. As a result of determining whether ECC correction is possible in Step S99, when the number of bits of write error is n or less, it is determined that error correction is possible, and the write operation is ended (normal end). As a result of determining whether ECC correction is possible in Step S99, when the number of bits of write error is n+1 or more, it is determined that error correction is impossible, and the write operation is ended (abnormal end). For multi-level memory cells, the above-mentioned write operation flow is repeated according to their level to cumulatively count the number of bits of write error. The above-mentioned operation flow determines whether ECC correction is possible before determining the number of writes, and ends normally when error correction is possible. Therefore, the write operation flow is suitable for stream data such as images, voice, and video that is not required to be highly correct. However, this operation flow reduces write time and improves performance.

The following describes a method of determining the number of bits of write error of multi-level memory cell with reference to FIGS. 10A and 10B. FIG. 10A shows one bit error as a result of the overwriting of "10" data of a four-value memory cell, and FIG. 10B shows two bit errors. Vth designates the threshold voltage of memory cell. As shown in FIG. 10A, assume that "10" data overwrites an area of "00" data. In this case, the number of error bits is zero as a result of determination in a determination level 1, and the number of error bits is one as a result of determination in a determination level 2. Therefore, the total number of error bits is one.

Error bit=determination level 1 (0 bit)+determination level 2 (1 bit)=1 bit.

As shown in FIG. 10B, assume that "10" data overwrites an area of "01" data. In this case, the number of error bits is one as a result of determination in a determination level 1, and the number of error bits is one as a result of determination in a determination level 2. Therefore, the total number of error bits is two.

Error bit=determination level 1 (1 bit)+determination level 2 (1 bit)=2 bits.

In the above case, the operation flow of FIG. 8 or 9 is repeated twice in the determination levels 1 and 2.

Therefore, according to the nonvolatile memory of the first embodiment, since it is determined whether the number of bits of write/erase error is n or less, and the result is stored in the status register 20, whether ECC correction is possible can be determined by reading the content of the status register 20 from the outside. As a result, null reading of memory data becomes unnecessary and a load on an external controller is reduced. Moreover, since data is not read from the flash memory 111, the performance of the flash memory 111 is not affected.

Second Embodiment

Figure 11:
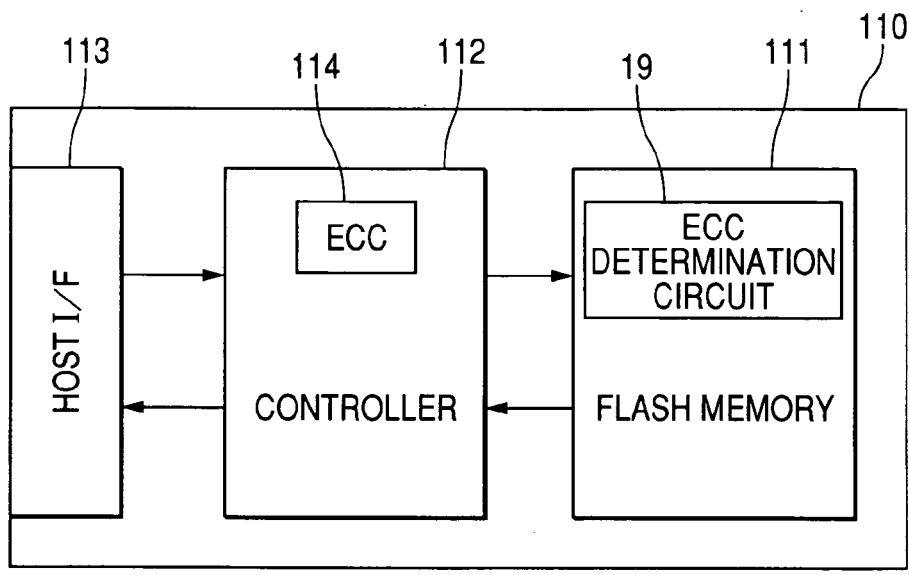
FIG. 11 is a block diagram showing the configuration of a memory card according to a second embodiment of the present invention.
Figure 12:
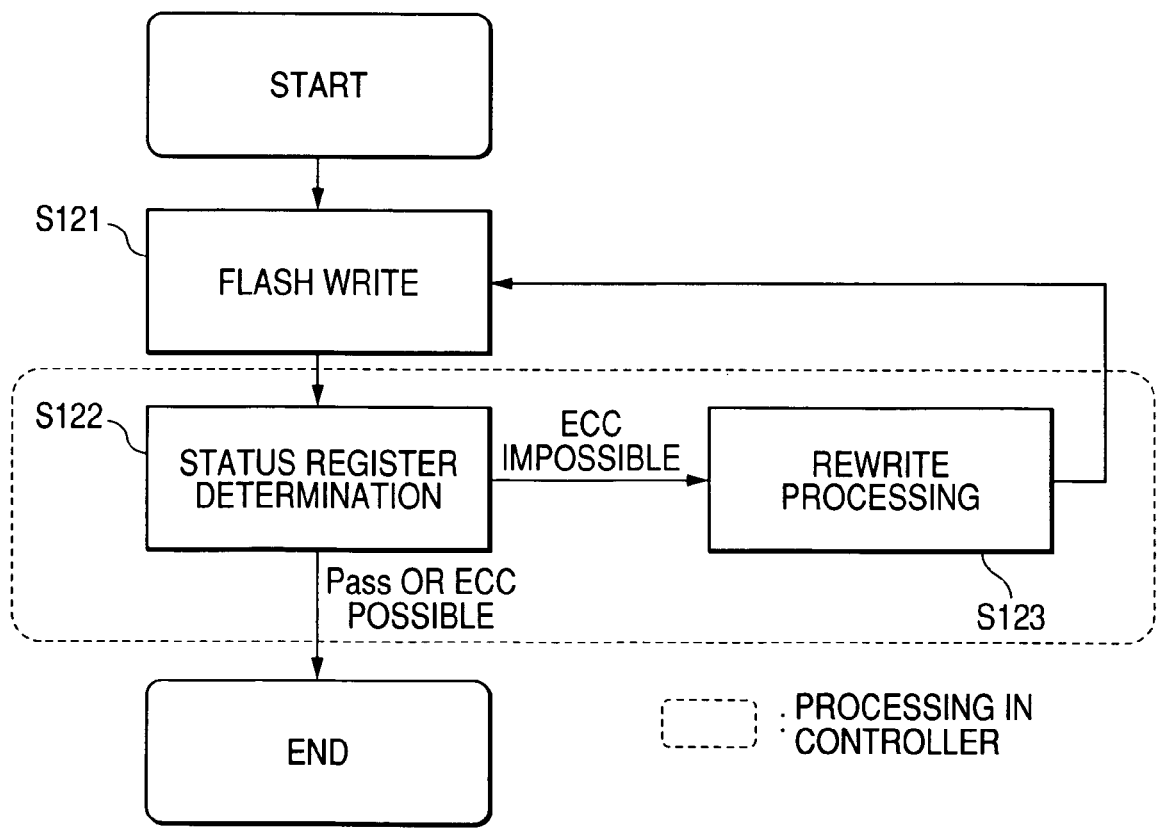
FIG. 12 is a drawing showing an example of a write flow in a memory card of a second embodiment of the present invention.
Figure 13:
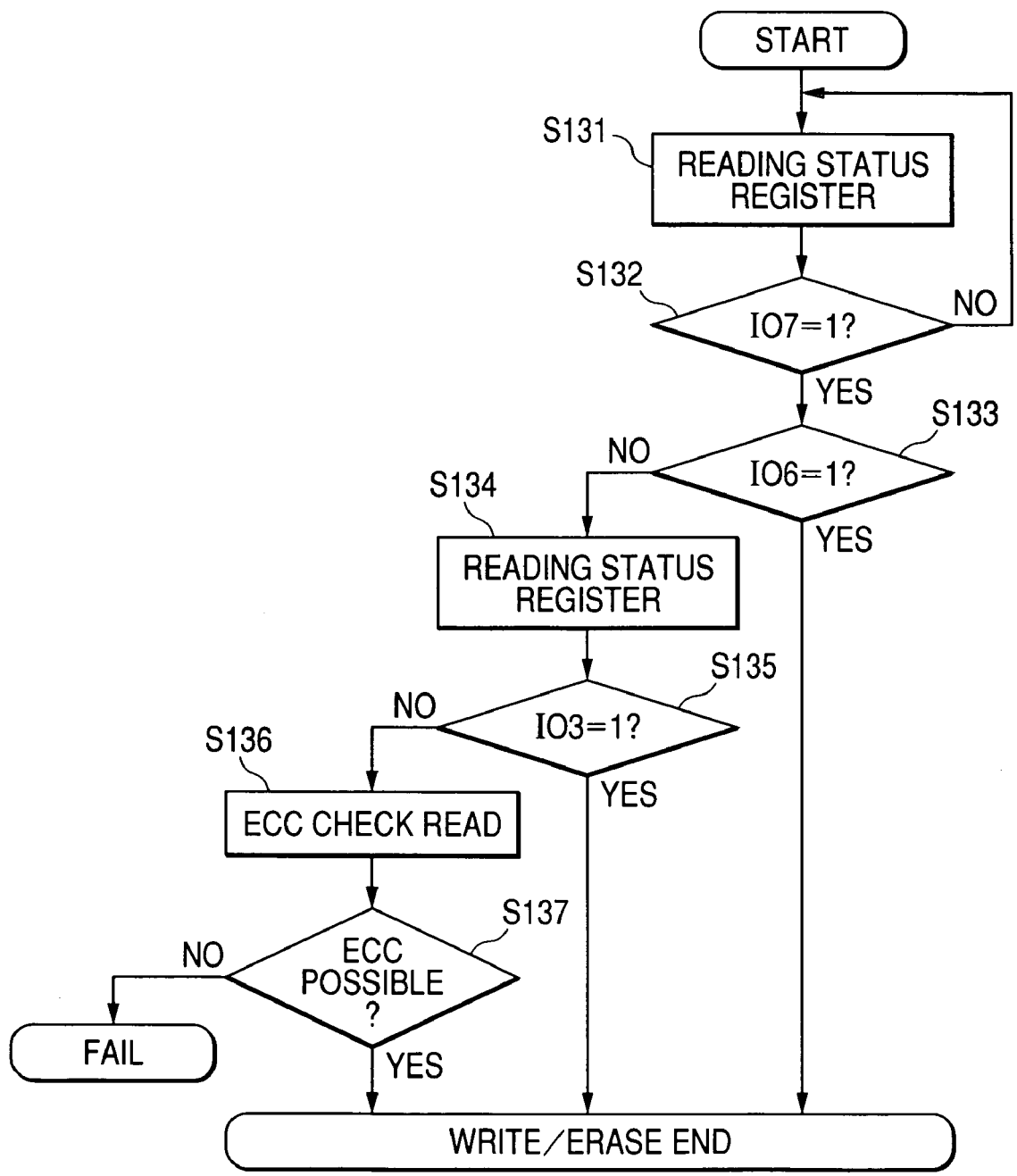
FIG. 13 is a drawing showing the flow of writing by a controller in a memory card of a second embodiment of the present invention.
Figure 14:
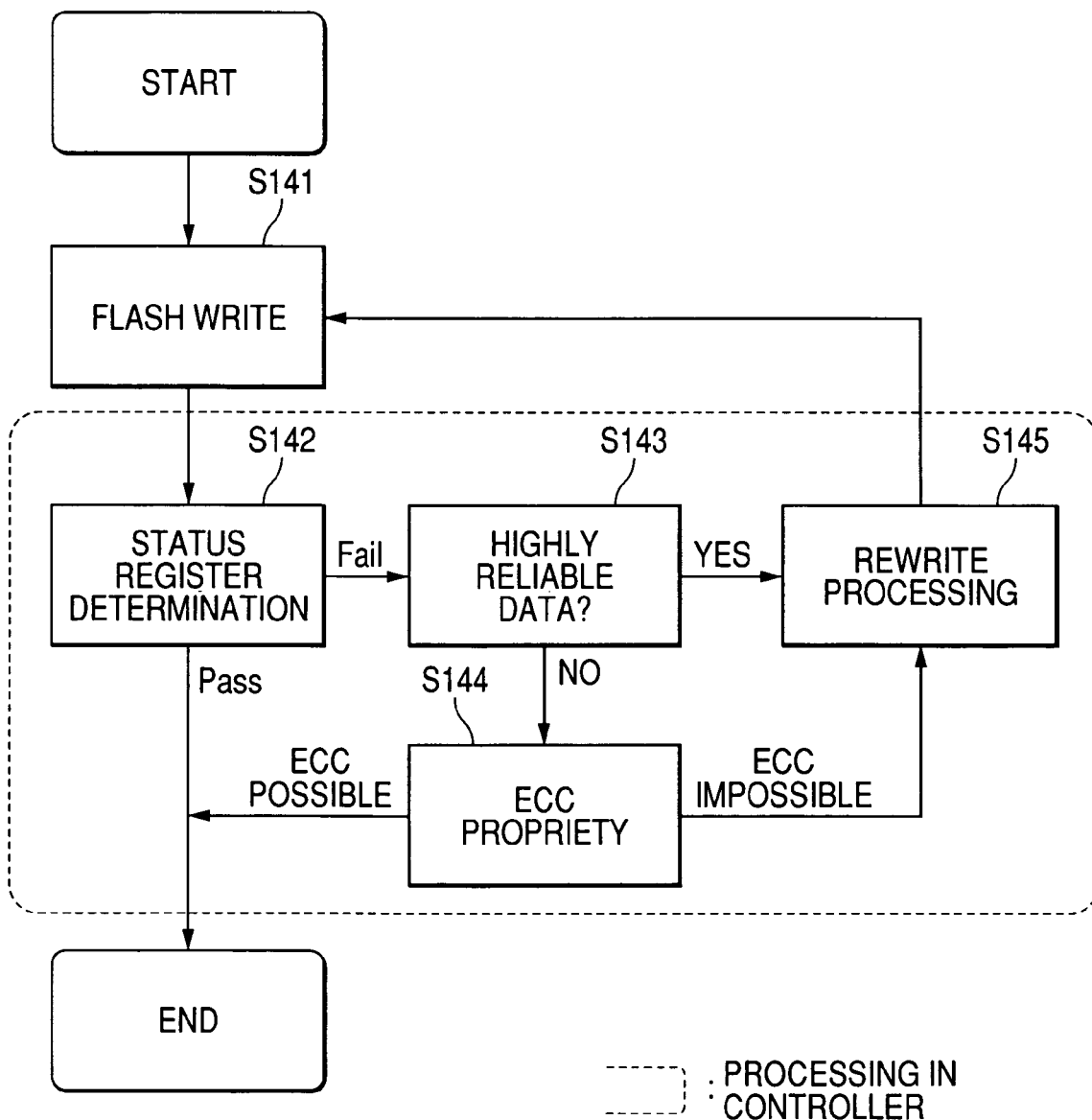
FIG. 14 is a drawing showing an example of a write flow in a memory card of a second embodiment of the present invention.

FIG. 11 is a block diagram showing the configuration of a memory card of a second embodiment of the present invention. FIG. 12 is a drawing showing an example of a write flow in the memory card of the second embodiment. FIG. 13 is a drawing showing the flow of writing by a controller. FIG. 14 is a drawing showing another example of a write flow in the memory card.

Referring to FIG. 11, a description will be made of an example of the configuration of the memory card of the second embodiment. A memory card 110 of the second embodiment includes the flash memory 111 of the first embodiment, a controller 112, a host I/F (interface) 113, and the like. The flash memory 111 includes the ECC determination circuit 19 (error correction determination part) and the like. The controller 112 includes an ECC (error correction propriety determination part) 114 and the like. The flash memory 111 and the controller 112, and the controller 112 and the host I/F 113 are respectively connected.

The controller 112 controls memory operations such as write/erase/read on the flash memory 111. It includes means for reading pass/fail information (IO6) of write operation on the flash memory 111 and information (IO3) about the number of bits of write error from the status register 20, and ECC (error correction propriety determination part) 114 that determines whether to correct write errors based on information (IO3) about the number of bits of write error when pass/fail information (IO6) of write operation indicates fail. The host I/F 113 is an interface with the outside.

The following describes the flow of writing to the memory card 110 of the second embodiment with reference to FIG. 12. In Step S121, writing to the flash memory 111 is performed. The writing to the flash memory is performed according to the write operation flows of FIGS. 6 to 9 described in the first embodiment. The controller 112 determines the status register 20 in Step S122. The status register determination processing reads information of the status register 20 in the flash memory 111, and determines as pass when the value of IO6 is "1", as fail when "0", as ECC correction possible (the number of error bits is n or less) when the value of IO3 is "1", and as ECC correction impossible (the number of error bits is n+1 or more) when the value of IO3 is "0". For a pass or ECC correction possible result, the write flow ends immediately. For a fail and ECC correction impossible result, rewrite processing is performed in Step S123, and control is returned to Step S121 to perform writing to the flash memory. Processing of Steps S122 and S123 is performed by the controller 112. The value of n bits depends on the ECC specifications of the memory card and the like. The value of n bits is decided depending on whether errors can be corrected by the controller 112.

The following describes the flow of writing by the controller 112 with reference to FIG. 13.

The controller 112 reads information of the status register 20 in Step S131. In Step S132, it checks whether the value of IO7 in the status register 20 is "1", and returns to Step S131 when not "1", that is, "0" (busy). When the value of IO7 is "1" (ready), it proceeds to Step S133. In Step S133, it checks the value of IO6, and ends the write/erase operation when "1" (pass). It proceeds to Step S134 when the value of IO6 is "0" (fail). In Step S134, it reads again information of the status register 20, and in Step S135, checks the value of IO3. When the value of IO3 is "1" (the number of error bits is n or less), it determines that ECC correction is possible, and ends the write/erase operation. When the value of IO3 is "0" (the number of error bits is n+1 or more), it proceeds to Step S136. After performing ECC check reading in Step S136, it determines whether ECC correction is possible, in Step S137. When ECC correction is possible, it ends the write/erase operation. When ECC correction is impossible, it performs rewrite processing.

Therefore, according to the memory card of the second embodiment, whether ECC correction is possible is determined in the flash memory side (on-chip determination) instead of a controller within conventional memory cards. As a result, null reading of memory data by a controller becomes unnecessary and a load on the controller can be reduced.

The following describes another example of the flow of writing to a memory card with reference to FIG. 14.

The controller 112 is provided with the following means. When data written to the flash memory 111 is data required to be highly reliable, the writing to the flash memory 111 is ended when pass/fail information (IO6) of write operation indicates pass; when data written to the flash memory 111 is data not required to be highly reliable, the writing to the flash memory 111 is ended when pass/fail information (IO6) of write operation indicates pass, or it is determined by ECC 114 that correction is possible.

A description of Step S141 will be omitted because it is the same as Step S121 in FIG. 12. In Step S142, the controller 112 determines the status register 20. The status register determination processing reads information of the status register 20 in the flash memory 111, and when the value of IO6 is "1" (pass), the write flow ends. When the value of IO6 is "0" (fail), the controller 112 proceeds to Step S143. In Step S143, it determines whether data written to the flash memory is highly reliable data, and if so, proceeds to Step S145 to perform rewrite processing. Then, it returns to Step 141 to perform writing to the flash memory again. When determining in Step S143 that the data is not highly reliable data, it determines whether ECC correction is possible, in Step S144. As a result of determining whether ECC correction is possible, when the value of IO3 in the status register 20 is "1" and ECC correction is possible (the number of error bits is n or less), the write flow ends immediately. When the value of IO3 is "0" and ECC correction is impossible (the number of error bits is n+1 or more), after performing rewrite processing in Step S145, the controller 112 returns to Step S141 to perform writing to the flash memory. Processing of Steps S142 to S145 is performed by the controller 112.

Specifically, error zero bits and ECC correction propriety status are used, and for data not required to be highly reliable such as stream data, writing is ended when writing fails and the number of error bits is small (n or less), and for data required to be highly reliable such as text, writing is ended when writing passes. By this arrangement, ECC correction can be performed flexibly according to the reliability of data.

Hereinbefore, though the invention made by the inventors of the present invention has been described in detail based on the preferred embodiments, it goes without saying that the present invention is not limited to the preferred embodiments, but may be modified in various ways without changing the main purports of the present invention.

For example, although a flash memory has been described as a nonvolatile memory in the foregoing embodiments, the present invention is not limited to the flash memory, and may apply to other nonvolatile memories such as EEPROM.

The invention disclosed in the present patent application may apply to nonvolatile memories such as a flash memory and EEPROM.

What is claimed is:

1. A nonvolatile memory which includes plural electrically erasable and electrically writable nonvolatile memory cells and performs write-and-verify processing in a write operation on the nonvolatile memory cells, the nonvolatile memory comprising:

an error correction determination unit that counts a number of bits of write error detected in the write-and-verify processing, and outputs first information; and a register for holding pass/fail information of the write operation and the first information about the number of bits of write error outputted from the error correction determination unit, wherein the first information about the number of bits of write error held in the register indicates whether the number of bits of write error is n or less, and wherein the error correction determination unit includes a first circuit for setting n to any value.

2. The nonvolatile memory according to claim 1, wherein the nonvolatile memory cells are multi-level memory cells.

3. A memory card which comprises: a nonvolatile memory that includes plural electrically erasable and electrically writable nonvolatile memory cells and performs write-and-verify processing in a write operation on the nonvolatile memory cells; and a controller that controls the write operation of the nonvolatile memory, wherein the nonvolatile memory includes: an error correction determination unit that counts a number of bits of write error detected in the write-and-verify processing, and outputs first information; and a register for holding pass/fail information of the write operation and the first information about the number of bits of write error outputted from the error correction determination unit, wherein the controller includes: a first circuit for reading the pass/fail information of the write operation and the first information about the number of bits of write error from the register; and an error correction propriety determination unit that determines whether to correct the write error, based on the first information about the number of bits of write error when the pass/fail information of the write operation indicates fail, wherein the first information about the number of bits of write error held in the register indicates whether the number of bits of write error is n or less, and wherein the error correction determination unit includes a setting circuit for setting n to any value.

4. The memory card according to claim 3, wherein the value of n is decided depending on whether error correction is possible in the controller.

5. The memory card according to claim 4, wherein the controller has a determination function that, when data to be written to the nonvolatile memory is required to be highly reliable, ends writing to the nonvolatile memory when the pass/fail information of the write operation indicates pass, and when data to be written to the nonvolatile memory is not required to be highly reliable, ends writing to the nonvolatile memory when the pass/fail information of the write operation indicates pass, or when it is determined by the error correction propriety determination unit that correction is possible.

6. The memory card according to claim 5, wherein the nonvolatile memory cells are multi-level memory cells.

* * * * *